(12) United States Patent
Tsai

(10) Patent No.: US 11,869,849 B2
(45) Date of Patent: Jan. 9, 2024

(54) SEMICONDUCTOR PACKAGE WITH EMI SHIELDING STRUCTURE

(71) Applicant: MEDIATEK INC., Hsin-Chu (TW)

(72) Inventor: Shiann-Tsong Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/739,196

(22) Filed: May 9, 2022

(65) Prior Publication Data

US 2022/0262741 A1    Aug. 18, 2022

Related U.S. Application Data

(62) Division of application No. 16/930,278, filed on Jul. 15, 2020, now Pat. No. 11,355,450.

(60) Provisional application No. 62/881,422, filed on Aug. 1, 2019, provisional application No. 62/881,431, filed on Aug. 1, 2019.

(51) Int. Cl.
*H01L 23/552* (2006.01)
*H01L 23/31* (2006.01)
*H01L 23/498* (2006.01)

(52) U.S. Cl.
CPC ........ *H01L 23/552* (2013.01); *H01L 23/3121* (2013.01); *H01L 23/49811* (2013.01); *H01L 23/49861* (2013.01)

(58) Field of Classification Search
None
See application file for complete search history.

(56) References Cited

U.S. PATENT DOCUMENTS

| | | | |
|---|---|---|---|
| 2007/0278646 A1 | 12/2007 | Ogata | |
| 2007/0296087 A1 | 12/2007 | Ogata | |
| 2009/0284947 A1 | 11/2009 | Beddingfield | |
| 2010/0213585 A1 | 8/2010 | Usami | |
| 2012/0068361 A1* | 3/2012 | Haba | H01L 24/49 438/109 |
| 2012/0241979 A1* | 9/2012 | Choi | H01L 24/83 257/E23.024 |
| 2012/0281286 A1 | 11/2012 | Manipatruni | |
| 2013/0137217 A1* | 5/2013 | Kindo | H01L 21/50 438/109 |

(Continued)

FOREIGN PATENT DOCUMENTS

| | | |
|---|---|---|
| TW | M254725 | 1/2005 |
| TW | 200818445 | 4/2008 |
| TW | 200836306 | 9/2008 |

*Primary Examiner* — Long Pham
(74) *Attorney, Agent, or Firm* — Winston Hsu

(57) ABSTRACT

A semiconductor package includes a carrier substrate having a top surface; a semiconductor die mounted on the top surface; first bonding wires connecting the semiconductor die to the carrier substrate; an insulating material encapsulating the plurality of first bonding wires; a component having a metal layer mounted on the insulating material; second bonding wires connecting the metal layer of the component to the carrier substrate; and a molding compound covering the top surface of the carrier substrate and encapsulating the semiconductor die, the component, the first bonding wires, the second bonding wires, and the insulating material. The metal layer and the second bonding wires constitute an electromagnetic interference (EMI) shielding structure.

14 Claims, 4 Drawing Sheets

(56) References Cited

U.S. PATENT DOCUMENTS

| | | | |
|---|---|---|---|
| 2013/0256865 A1* | 10/2013 | Umeki | H01L 23/3135 |
| | | | 257/690 |
| 2014/0291871 A1* | 10/2014 | Haba | H01L 23/552 |
| | | | 257/784 |
| 2018/0166414 A1 | 6/2018 | Tsai | |
| 2020/0185450 A1* | 6/2020 | Venkatadri | H01L 27/14623 |

* cited by examiner

US 11,869,849 B2

SEMICONDUCTOR PACKAGE WITH EMI SHIELDING STRUCTURE

CROSS REFERENCE TO RELATED APPLICATION

This application is a division of U.S. application Ser. No. 16/930,278, filed on Jul. 15, 2020, which claims the benefit of U.S. Provisional Application No. 62/881,422, filed on Aug. 1, 2019, and claims the benefit of U.S. Provisional Application No. 62/881,431, filed on Aug. 1, 2019. The contents of these applications are incorporated herein by reference.

BACKGROUND

The present disclosure relates generally to the field of semiconductor packaging. More particularly, the present disclosure relates to a semiconductor integrated circuit (IC) package with package-level EMI shielding.

In the IC packaging industry, there is a continuous desire to provide higher and higher density IC packages for semiconductor die having increasing numbers of input/output (I/O) terminal pads. When using a conventional wire bonding packaging technique, the pitch, or spacing between adjacent bonding wires becomes finer and finer as the number of I/O terminal pads increases for a given size die.

During the molding or encapsulation of a plastic IC package, the flow of a plastic molding compound melt into a mold cavity exerts forces sufficiently high as to displace or deform the bonding wires, hence resulting in bonding wire sweep or mold wire sweep. The wire deformation causes adjacent bond wires to come into contact with each other, which results in shorting between adjacent wires.

Although a variety of approaches have been suggested for reducing the bonding wire sweep during the encapsulating process of an IC package, many of these approaches require additional process steps or require specialized equipment. These requirements for additional process steps or specialized equipment add to the costs of producing the package and are therefore undesirable.

As known in the art, electrostatic discharge (ESD) and electromagnetic interference (EMI) are problematic issues in the field of semiconductor technology. Electrostatic discharge could cause damage to semiconductors and other circuit components in integrated circuits. Electromagnetic interference is caused by electromagnetic radiation and is a significant consideration in electronic circuit design. Electromagnetic radiation is emitted by electronic circuits and components carrying changing electrical signals.

It is desirable to shield sensitive components from the source of any electromagnetic radiation. It is also desirable to reduce the probability of ESD damaging the circuit components in the semiconductor package.

SUMMARY

It is an object of the invention to provide an improved semiconductor package having stabilized, insulator-coated bonding wires and package-level EMI shielding structure in order to solve the above-mentioned prior art problems and shortcomings.

One aspect of the invention provides a semiconductor package including a carrier substrate having a top surface; a semiconductor die mounted on the top surface; a plurality of first bonding wires connecting the semiconductor die to the carrier substrate; an insulating material encapsulating the plurality of first bonding wires; a component having a metal layer mounted on the insulating material; a plurality of second bonding wires connecting the metal layer of the component to the carrier substrate; and a molding compound covering the top surface of the carrier substrate and encapsulating the semiconductor die, the component, the plurality of first bonding wires, the plurality of second bonding wires, and the insulating material. The metal layer and the plurality of second bonding wires constitute an electromagnetic interference (EMI) shielding structure.

According to some embodiments, the component comprises a dummy silicon die.

According to some embodiments, the component is attached to the insulating material by an adhesive layer.

According to some embodiments, the metal layer is a continuous layer of metal that completely covers a surface of the component so as to form a lid of the EMI shielding structure.

According to some embodiments, the metal layer comprises an aluminum layer.

According to some embodiments, the plurality of second bonding wires is electrically coupled to a ground ring on the top surface of the carrier substrate.

According to some embodiments, the plurality of second bonding wires and the metal layer are grounded.

According to some embodiments, the insulating material is disposed in a rectangular, ring shape around the semiconductor die.

According to some embodiments, the insulating material and the molding compound have different compositions.

According to some embodiments, the insulating material completely covers the first bonding wires and is in direct contact with a peripheral region of an active surface of the semiconductor die.

According to some embodiments, the carrier substrate comprises a packaging substrate.

According to some embodiments, the semiconductor package further comprises a spacer between the component and the semiconductor die.

Another aspect of the invention provides a semiconductor package including a carrier substrate having a top surface; a semiconductor die mounted on the top surface; a plurality of first bonding wires connecting the semiconductor die to the carrier substrate; a first insulating material encapsulating the plurality of first bonding wires; a component having a metal layer mounted on the insulating material; a plurality of second bonding wires connecting the metal layer of the component to the carrier substrate; a second insulating material encapsulating the plurality of second bonding wires; and a molding compound covering the top surface of the carrier substrate and encapsulating the semiconductor die, the component, the plurality of first bonding wires, the plurality of second bonding wires, the first insulating material, and second insulating material. The metal layer and the plurality of second bonding wires constitute an EMI shielding structure.

According to some embodiments, the component comprises a dummy silicon die.

According to some embodiments, the component is attached to the insulating material by an adhesive layer.

According to some embodiments, the metal layer is a continuous layer of metal that completely covers a surface of the component so as to form a lid of the EMI shielding structure.

According to some embodiments, the metal layer comprises an aluminum layer.

According to some embodiments, the plurality of second bonding wires is electrically coupled to a ground ring on the top surface of the carrier substrate.

According to some embodiments, the plurality of second bonding wires and the metal layer are grounded.

According to some embodiments, the first insulating material is disposed in a rectangular, ring shape around the semiconductor die.

According to some embodiments, the first insulating material and the molding compound have different compositions.

According to some embodiments, the first insulating material completely covers the plurality of first bonding wires and is in direct contact with a peripheral region of an active surface of the semiconductor die.

According to some embodiments, the second insulating material completely covers the plurality of second bonding wires and is in direct contact with a perimeter and a bottom surface of the component.

According to some embodiments, the first insulating material and the second insulating material have different compositions.

According to some embodiments, the carrier substrate comprises a packaging substrate.

According to some embodiments, the semiconductor package further comprises a spacer between the component and the semiconductor die.

According to another aspect, a semiconductor package includes a carrier substrate having a top surface; a semiconductor die mounted on the top surface in a flip-chip fashion; a component with a metal layer stacked on the semiconductor die; a plurality of bonding wires connecting the metal layer of the component to the carrier substrate; an insulating material encapsulating the plurality of bonding wires; and a molding compound covering the top surface of the carrier substrate and encapsulating the semiconductor die, the component, the plurality of bonding wires, and the insulating material. The metal layer and the plurality of second bonding wires constitute an EMI shielding structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
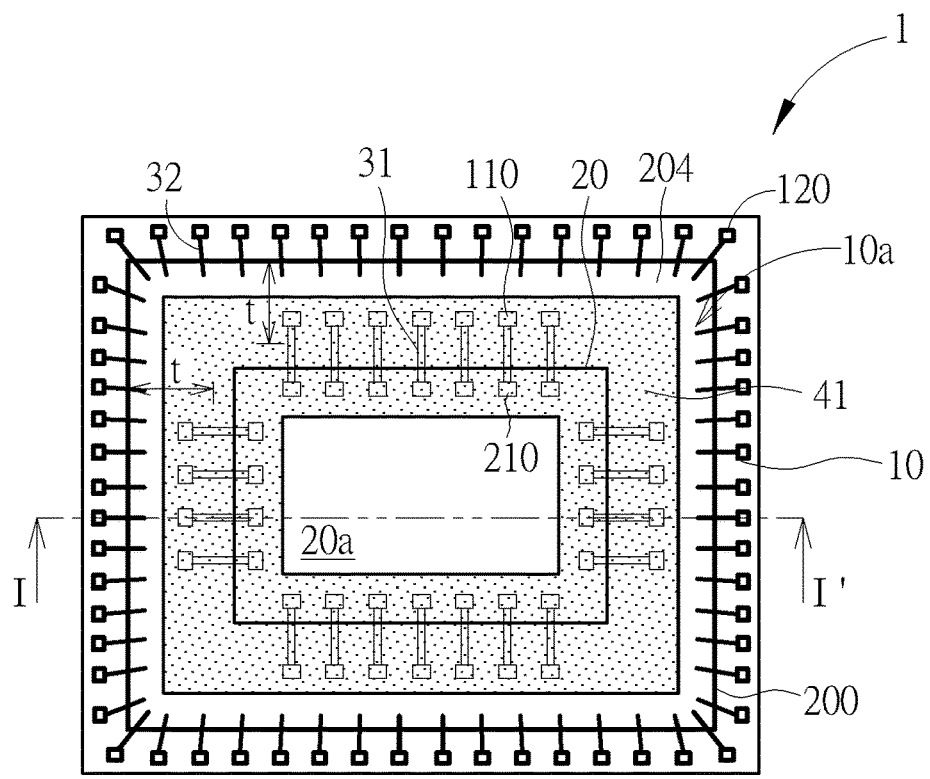
FIG. 1 is a schematic top view of a semiconductor package according to one embodiment of the invention.
Figure 2:
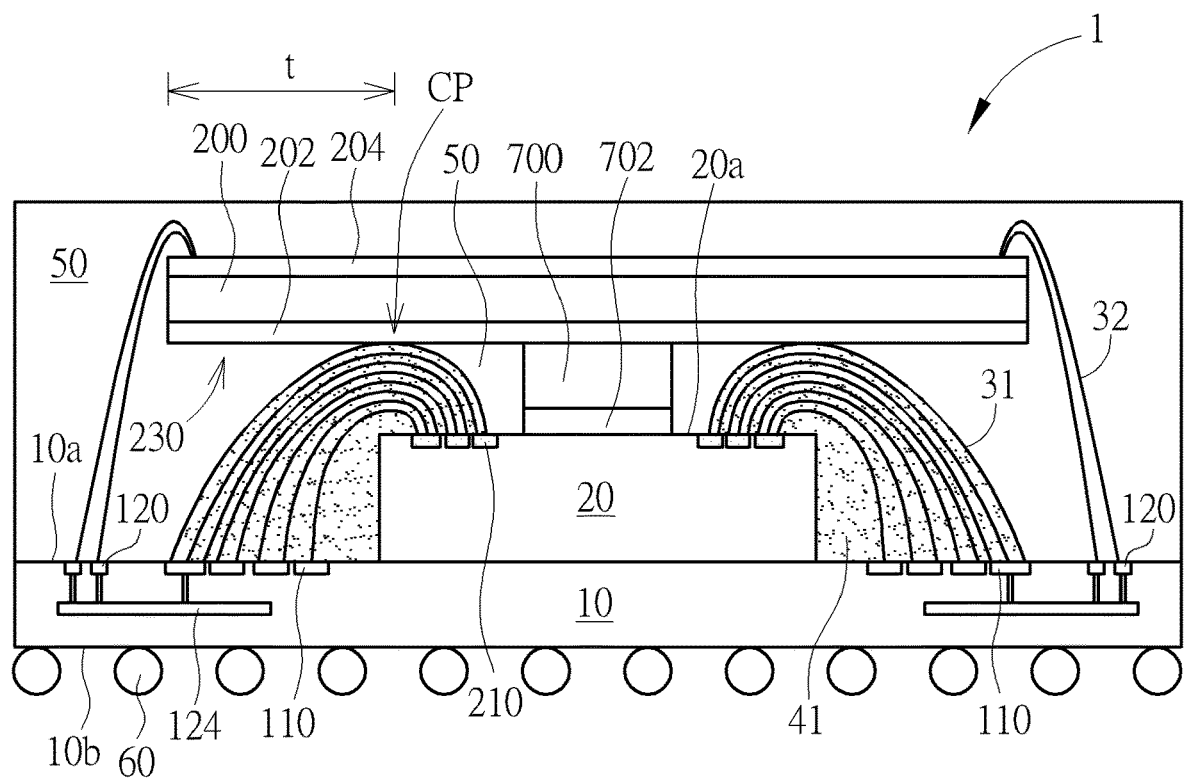
FIG. 2 is a schematic, cross-sectional view taken along line I-I' in FIG. 1.

FIG. 1 is a schematic top view of a semiconductor package according to one embodiment of the invention. FIG. 2 is a schematic, cross-sectional view taken along line I-I' in FIG. 1. As shown in FIG. 1 and FIG. 2, the semiconductor package 1 comprises a carrier substrate 10 having a top surface 10a and a bottom surface 10b. A semiconductor die 20 is directly mounted on the top surface 10a. The semiconductor die 20 has an active surface 20a, on which a plurality of input/output (I/O) pads 210 is distributed. According to the illustrative embodiment, the semiconductor die 20 may be electrically connected to the bond fingers 110 on the top surface 10a of the carrier substrate 10 through bonding wires 31. According to the illustrative embodiment, the bonding wires 31 may comprise copper, gold, silver, or any suitable conductive materials. According to the illustrative embodiment, the carrier substrate 10 may comprise a packaging substrate or an interposer substrate, but is not limited thereto.

According to the illustrative embodiment, an insulating material 41 is applied to encapsulate the bonding wires 31. For example, the insulating material 41 may be applied in a rectangular or ring shape around or about the semiconductor die 20, but is not limited thereto. The insulating material 41 may completely cover or wrap the bonding wires 31 and is in direct contact with only a peripheral region of the active surface 20a. Therefore, a central region of the active surface 20a may not be covered with the insulating material 41. However, it is understood that the insulating material 41 may cover only a portion of the bonding wires 31. The ring-shaped insulating material 41 may be continuous or may be discontinuous. According to the illustrative embodiment, the insulating material 41 may be in direct contact with the sidewalls of the semiconductor die 20.

According to the illustrative embodiment, the insulating material 41 may comprise polymers, epoxy, or resins, but is not limited thereto. The insulating material 41 coated on the bonding wires 31 may be cured to provide the bonding wires 31 with extra mechanical support. The insulating material 41 secures the bonding wires 31 and is able to resist the mold wire sweep during the subsequent encapsulation process. According to the illustrative embodiment, the insulating material 41 has low permittivity or low dielectric constant (low-k) that can prevent shorting and alleviate crosstalk between adjacent wires.

According to the illustrative embodiment, a component 200 is mounted directly on the insulating material 41 with an overhang 230 having a distance t between an edge of the component 200 and the contact point CP between the component 200 and the insulating material 41. The component 200 is supported by the insulating material 41 and the bonding wires 31. For example, the component 200 may be a dummy silicon die, a piece of metal, a ceramic die, a glass die, or a heat sink, but is not limited thereto. The component 200 may be attached to the insulating material 41 and the bonding wires 31 by using an adhesive layer 202. According to the illustrative embodiment, the component 200 may have a rectangular shape that is coextensive with the shape of the carrier substrate 10 and the component 200 may completely overlap with the semiconductor die 20.

According to the illustrative embodiment, the component 200 may be a dummy die such as a dummy silicon die that is coated with a metal layer 204 on one side of the dummy die. The metal layer 204 is a continuous layer of metal such as aluminum layer that completely covers the top surface of the component 200 so as to form a lid of the EMI shielding structure. The metal layer 204 is electrically coupled to the carrier substrate 10 through the bonding wires 32. The bonding wires 32 are bonded to respective bond fingers 120 disposed on the top surface 10*a* of the carrier substrate 10 and may be electrically coupled to a ground plane 124 of the carrier substrate 10. Therefore, the bonding wires 32 and the metal layer 204 are grounded. The metal layer 204 of the component 200 and the bonding wires 32 constitute a Faraday cage that shields the semiconductor die 20 from EMI interference. According to another embodiment, the bonding wires 32 may be bonded to a ground ring disposed on the top surface 10*a* of the carrier substrate 10. The bonding wires 32 are disposed around the periphery of die 20 to achieve better EMI interference effect.

Further, it is advantageous to use the invention because the component 200 and the bonding wires 32 can protect the semiconductor die 20 from ESD damage in an early stage of the package assembly process.

Figure 3:
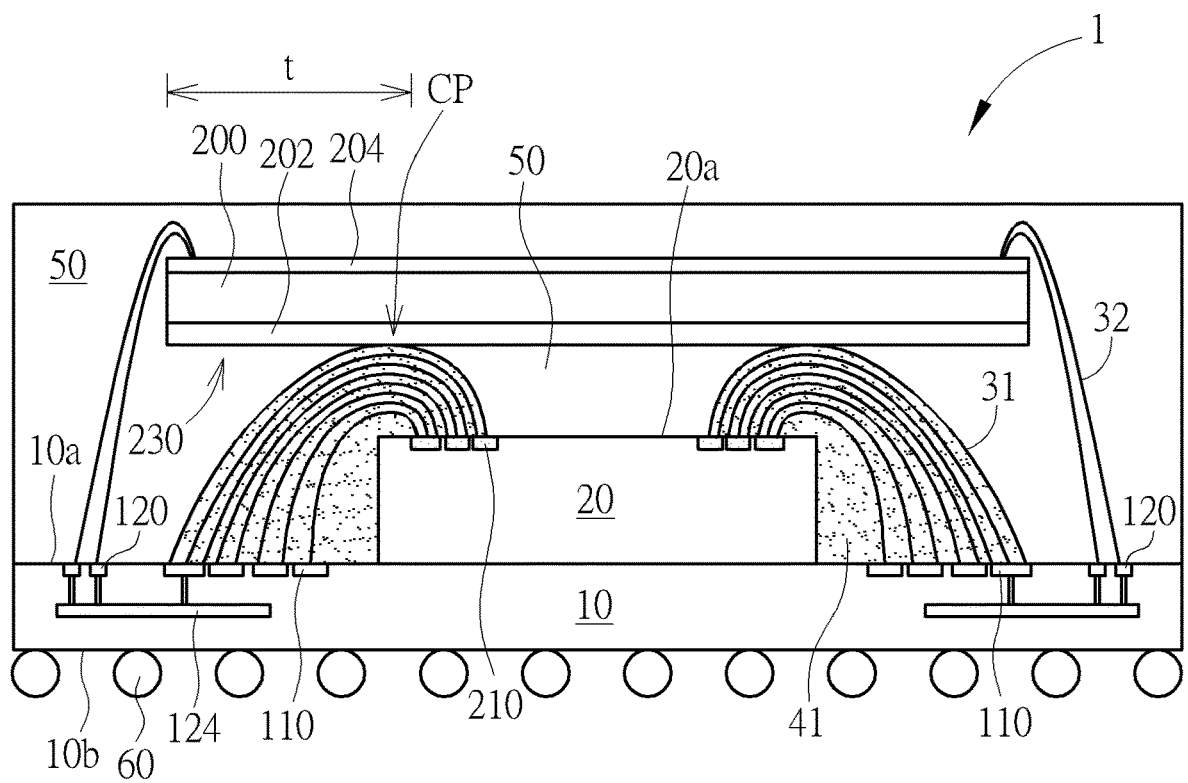
FIG. 3 is a schematic, cross-sectional diagram showing a semiconductor package according to another embodiment of the invention.

According to the illustrative embodiment, a spacer 700 may be disposed between the component 200 and the semiconductor die 20. The spacer 700 may be adhered to the active surface 20*a* of the semiconductor die 20 by using an adhesive layer 702. According to the illustrative embodiment, the spacer 700 may be a dummy die or any suitable material having matching coefficient of thermal expansion (CTE), but is not limited thereto. The thickness of the spacer 700 is adjustable. In some embodiments, the spacer 700 may be thicker such that the component 200 is not in direct contact with the insulating material 41 and the bonding wires 31. In some embodiments, the spacer 700 may be spared, as shown in FIG. 3.

According to the illustrative embodiment, a molding compound 50 is formed on the top surface 10*a* of the carrier substrate 10 to encapsulate the bonding wires 31 and 32, the insulating material 41, the component 200, the spacer 700 and the semiconductor die 20. According to the illustrative embodiment, the molding compound 50 may comprise an epoxy resin and a filler material, but is not limited thereto. According to the illustrative embodiment, the insulating material 41 may have the same epoxy composition as that of the molding compound 50, but without the filler material or with lower content of the filler material. According to the illustrative embodiment, the insulating material 41 and the molding compound 50 have different compositions. According to the illustrative embodiment, the insulating material 41 contains less than 50 ppm halogen content in order to prevent corrosion of the bonding wires 31. After the molding compound 50 is formed, connection elements 60 such as solder balls may be formed on the bottom surface 10*b*.

Figure 4:
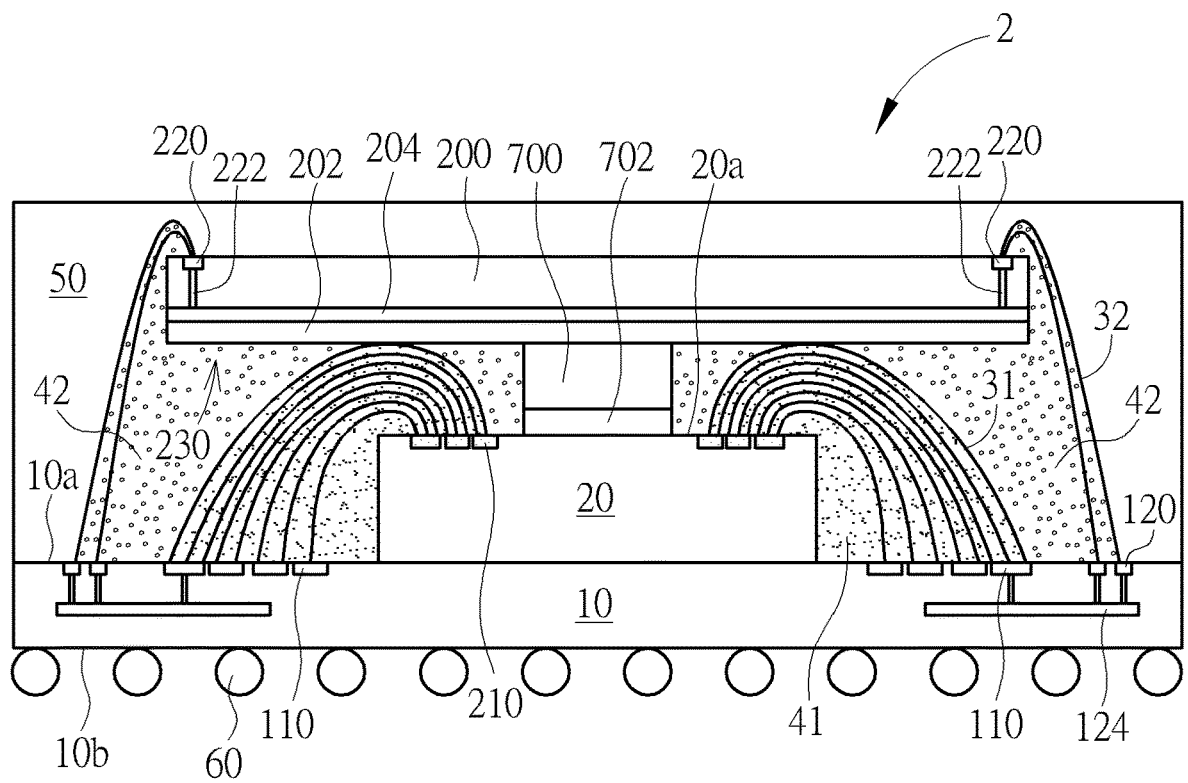
FIG. 4 is a schematic, cross-sectional diagram showing a semiconductor package according to still another embodiment of the invention.

FIG. 4 is a schematic, cross-sectional diagram showing a semiconductor package according to still another embodiment of the invention, wherein like layers, regions or elements are designated by like numeral numbers or labels. As shown in FIG. 4, likewise, the semiconductor package 2 comprises a carrier substrate 10 having a top surface 10*a* and a bottom surface 10*b*. A semiconductor die 20 is mounted on the top surface 10*a*. The semiconductor die 20 has an active surface 20*a*, on which a plurality of I/O pads 210 is distributed. According to the illustrative embodiment, the semiconductor die 20 may be electrically connected to the bond fingers 110 on the top surface 10*a* of the carrier substrate 10 through bonding wires 31. According to the illustrative embodiment, the bonding wires 31 may comprise copper, gold, silver, or any suitable conductive materials. According to the illustrative embodiment, the carrier substrate 10 may comprise a packaging substrate or an interposer substrate, but is not limited thereto.

According to the illustrative embodiment, an insulating material 41 is applied to the bonding wires 31. For example, the insulating material 41 may be applied in a rectangular, ring shape around or about the semiconductor die 20, but is not limited thereto. The insulating material 41 may completely cover the bonding wires 31 and is in direct contact with only a peripheral region of the active surface 20*a*. Therefore, a central region of the active surface 20*a* may not be covered with the insulating material 41. However, it is understood that the insulating material 41 may covers only a portion of the bonding wires 31. The ring-shaped insulating material 41 may be continuous or may be discontinuous. According to the illustrative embodiment, the insulating material 41 may be in direct contact with the sidewalls of the semiconductor die 20.

According to the illustrative embodiment, the insulating material 41 may comprise polymers, epoxy, or resins, but is not limited thereto. The insulating material 41 coated on the bonding wires 31 may be cured to provide the bonding wires 31 with extra mechanical support. The insulating material 41 secures the bonding wires 31 and is able to resist the mold wire sweep during the subsequent encapsulation process. According to the illustrative embodiment, the insulating material 41 has low permittivity or low dielectric constant (low-k) that can prevent shorting and alleviate crosstalk between adjacent wires.

According to the illustrative embodiment, a component 200 is mounted directly on the insulating material 41 with an overhang 230 having a distance t between an edge of the component 200 and the contact point CP between the component 200 and the insulating material 41. The component 200 is supported by the insulating material 41 and the bonding wires 31. For example, the component 200 may be a dummy silicon die, a piece of metal, a ceramic die, a glass die, or a heat sink, but is not limited thereto. The component 200 may be attached to the insulating material 41 and the bonding wires 31 by using an adhesive layer 202. According to the illustrative embodiment, the component 200 may have a rectangular shape that is coextensive with the shape of the carrier substrate 10 and the component 200 may completely overlap with the semiconductor die 20.

According to the illustrative embodiment, the component 200 may be a dummy die such as a dummy silicon die comprising a metal layer 204 that functions as an EMI shield layer and an adhesive layer 202 on the metal layer 204. The component 200 may be attached to the insulating material 41 and the bonding wires 31 by using the adhesive layer 202. The component 200 comprises a bond pads (or a ring) 220 disposed on the top surface of the component 200. The bonding wires 32 are bonded to the bond pads 220. The bond pads 220 are electrically connected to the metal layer 202 through the conductive vias 222.

According to the illustrative embodiment, an insulating material 42 may be applied to the bonding wires 32. For example, the insulating material 42 may be applied in a rectangular or ring shape around the insulating material 41 and the bonding wires 31. The insulating material 42 may completely cover the bonding wires 32 and is in direct contact with the active surface 20a, the spacer 700, the perimeter and bottom surface of the component 200. It is understood that the insulating material 42 may cover only a portion of the bonding wires 32. The ring-shaped insulating material 42 may be continuous or may be discontinuous. The insulating material 41 and the insulating material 42 may have different compositions.

Figure 5:
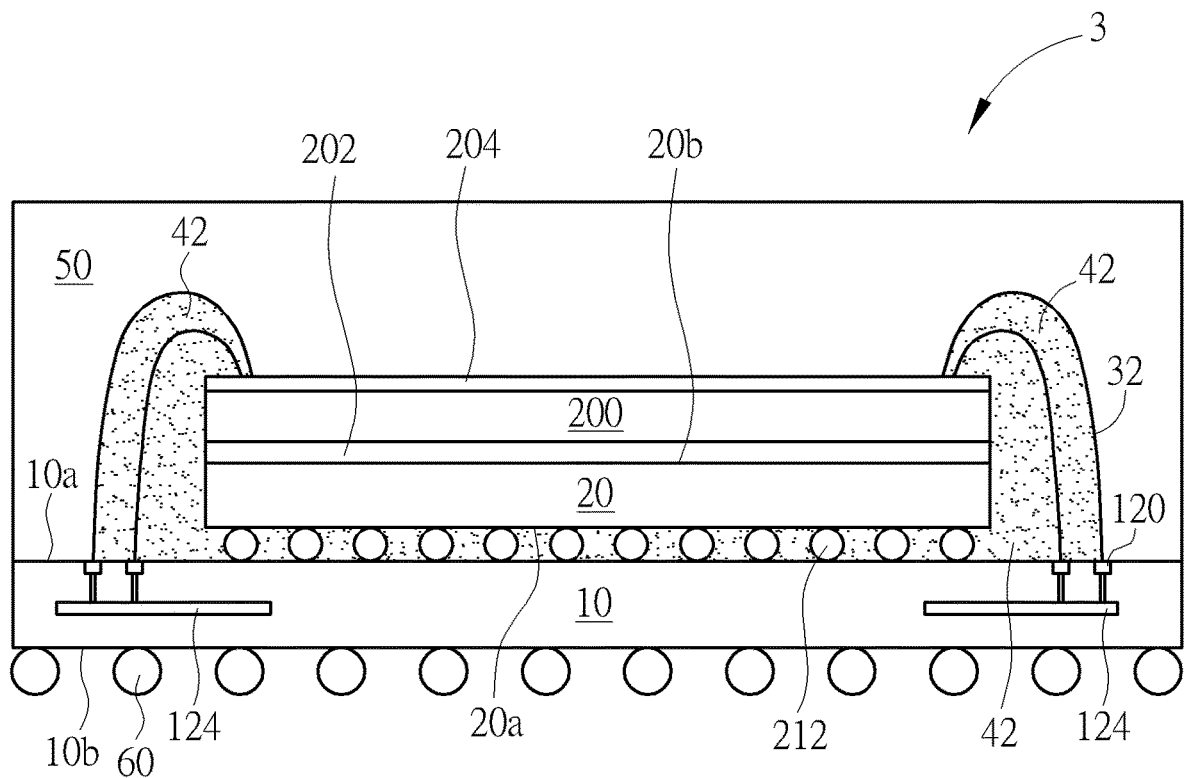
FIG. 5 is a schematic, cross-sectional diagram showing a semiconductor package according to still another embodiment of the invention.

FIG. 5 is a schematic, cross-sectional diagram showing a semiconductor package according to still another embodiment of the invention, wherein like layers, regions or elements are designated by like numeral numbers or labels. As shown in FIG. 5, likewise, the semiconductor package 3 comprises a carrier substrate 10 having a top surface 10a and a bottom surface 10b. According to the illustrative embodiment, the carrier substrate 10 may comprise a packaging substrate or an interposer substrate, but is not limited thereto. A semiconductor die 20 is mounted on the top surface 10a in a flip-chip fashion with its active surface 20a coupled to the top surface 10a of the carrier substrate 10 through a plurality of connecting elements 212. According to the illustrative embodiment, the connecting elements 212 may comprise copper, gold, silver, or any suitable conductive materials. For example, the connecting elements 212 may be copper pillars or copper bumps, but not limited thereto.

According to the illustrative embodiment, a component 200 is mounted directly on a rear surface 20b of the semiconductor die 20. For example, the component 200 may be a dummy silicon die, a piece of metal, a ceramic die, a glass die, or a heat sink, but is not limited thereto. The component 200 may be attached to the semiconductor die 20 by using an adhesive layer 202. According to the illustrative embodiment, the component 200 may be a dummy die such as a dummy silicon die that is coated with a metal layer 204 on one side of the dummy die. The metal layer 204 is a continuous layer of metal such as aluminum layer that completely covers the top surface of the component 200 so as to form a lid of the EMI shielding structure. The metal layer 204 is electrically coupled to the carrier substrate 10 through the bonding wires 32. The bonding wires 32 are bonded to respective bond fingers 120 disposed on the top surface 10a of the carrier substrate 10 and may be electrically coupled to a ground plane 124 of the carrier substrate 10. Therefore, the metal layer 204 is grounded. The metal layer 204 of the component 200 and the bonding wires 32 constitute a Faraday cage that shields the semiconductor die 20 from EMI interference. According to another embodiment, the bonding wires 32 may be bonded to a ground ring disposed on the top surface 10a of the carrier substrate 10. The bonding wires 32 are disposed around the periphery of die 20 to achieve better EMI interference effect.

According to the illustrative embodiment, an insulating material 42 may be applied to the bonding wires 32. For example, the insulating material 42 may be applied in a rectangular or ring shape. The insulating material 42 may completely cover the bonding wires 32 and is in direct contact with the perimeter and active surface 20a of the semiconductor die 20, the connecting elements 212, and the perimeter of the component 200. It is understood that the insulating material 42 may cover only a portion of the bonding wires 32. The ring-shaped insulating material 42 may be continuous or may be discontinuous. The insulating material 42 may fill into the gap between the active surface 20a of the semiconductor die 20 and the top surface 10a of the carrier substrate 10. Therefore, the conventional underfill dispensing process may be spared.

Figure 6:
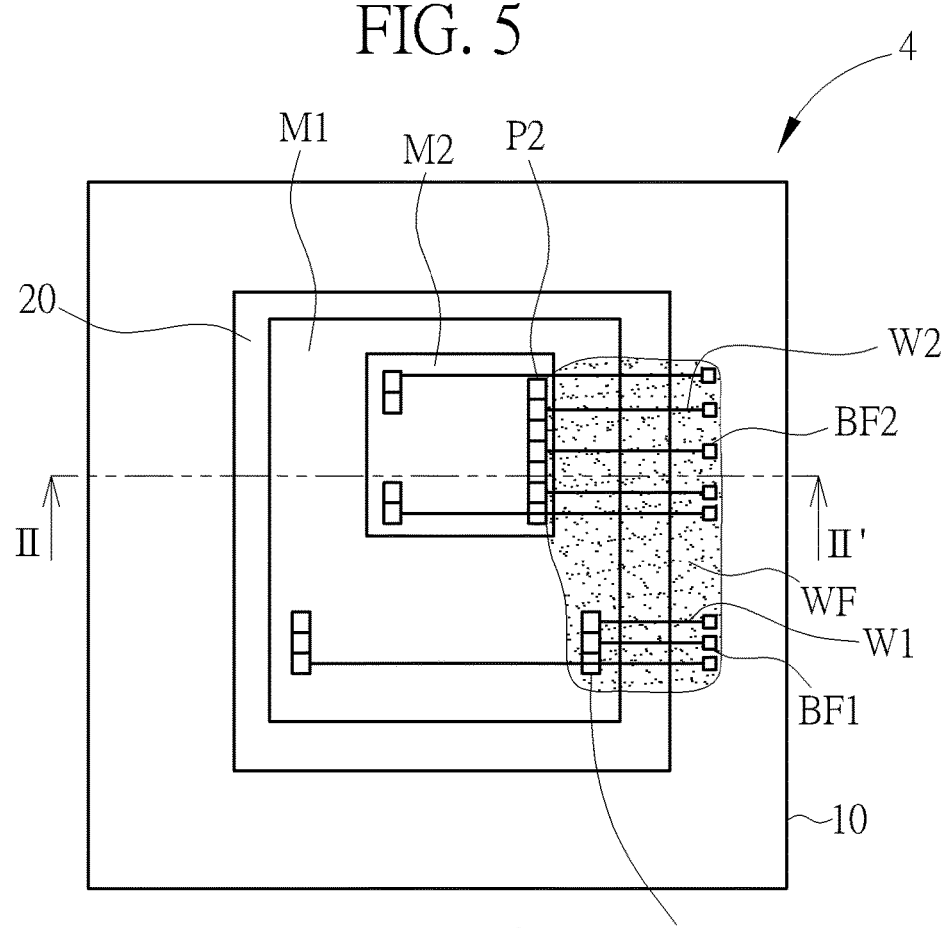
FIG. 6 is a schematic top view of a multi-chip semiconductor package according to one embodiment of the invention.
Figure 7:
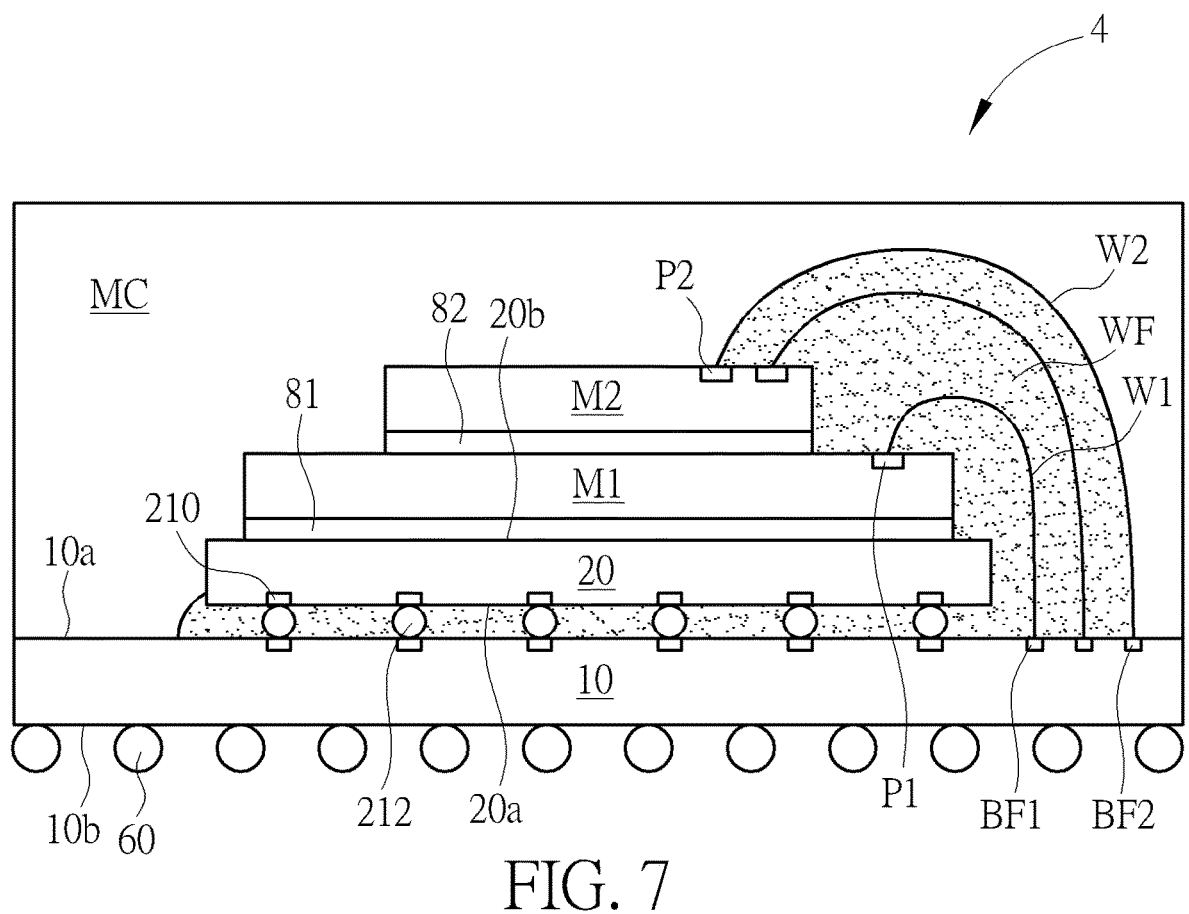
FIG. 7 is a schematic, cross-sectional view taken along line II-II' in FIG. 6.

Please refer to FIG. 6 and FIG. 7. FIG. 6 is a perspective top view of a multi-chip semiconductor package according to one embodiment of the invention. FIG. 7 is a schematic, cross-sectional view taken along line II-II' in FIG. 6. As shown in FIG. 6 and FIG. 7, the semiconductor package 4 comprises a carrier substrate 10 having a top surface 10a and a bottom surface 10b. According to the illustrative embodiment, the carrier substrate 10 may comprise a packaging substrate or an interposer substrate, but is not limited thereto. A semiconductor die 20 such as a System on a Chip (SoC) is mounted on the top surface 10a in a flip-chip fashion with its active surface 20a coupled to the top surface 10a of the carrier substrate 10 through a plurality of connecting elements 212. According to the illustrative embodiment, the connecting elements 212 may comprise copper, gold, silver, solder, or any suitable conductive materials. For example, the connecting elements 212 may be copper pillars or copper bumps, but not limited thereto.

According to the illustrative embodiment, at least a memory die M1 is stacked and mounted on the rear surface 20b of the semiconductor die 20 by using an adhesive layer 81. For example, the memory die M1 may be a 4 MB serial flash RAM die, but is not limited thereto. According to the illustrative embodiment, at least a memory die M2 may be stacked and mounted on the memory die M1 by using an adhesive layer 82. For example, the memory die M2 may be a 4 MB Pseudo SRAM die, but is not limited thereto. According to the illustrative embodiment, the memory die M1 comprises pads P1, which are electrically connected to the respective pads BF1 on the top surface 10a of the carrier substrate 10 through the bonding wires W1. According to the illustrative embodiment, the memory die M2 comprises pads P2, which are electrically connected to the respective pads BF2 on the top surface 10a of the carrier substrate 10 through the bonding wires W2. It is to be understood that the 3D stack configuration in FIG. 6 and FIG. 7 are for illustration purposes only.

According to the illustrative embodiment, an insulating material WF such as flowable resin with appropriate fluidity may be applied to the bonding wires W1 and W2. For example, the insulating material WF may be applied along a perimeter of the memory die M1 and the memory die M2. The insulating material WF may completely cover the bonding wires W1 and W2. It is understood that the insulating material WF may cover only a portion of the bonding wires W1 and W2. When applying the insulating material WF onto the bonding wires W1 and W2, the insulating material WF also flows into the gap between the semiconductor die 20 and the carrier substrate 10 due to capillary effect such that the insulating material WF can surround and protect the connecting elements 212. Compared to the prior art, the pads BF1 and BF2 on the top surface 10a of the carrier substrate 10 can be disposed closer to the semiconductor die 20 since the conventional underfilling process can be omitted. Therefore, the size of the semiconductor package 4 can be more compact. According to some embodiments, additional insulating material WF may be dispensed along the perimeter of the semiconductor die 20 to ensure that the gap between the semiconductor die 20 and the carrier substrate 10 is completely underfilled.

According to the illustrative embodiment, a molding compound MC is formed on the top surface 10a of the carrier substrate 10 to encapsulate the insulating material WF, the memory die M1, the memory die M2, the semiconductor die 20, and the top surface 10a of the carrier substrate 10. According to the illustrative embodiment, the molding compound MC may comprise an epoxy resin and a filler material, but is not limited thereto. According to the illustrative embodiment, the insulating material WF may have the same epoxy composition as that of the molding compound MC, but without the filler material or with lower content of the filler material. According to the illustrative embodiment, the insulating material WF and the molding compound MC have different compositions. According to the illustrative embodiment, the insulating material WF contains less than 50 ppm halogen content in order to prevent corrosion of the bonding wires W1 and W2. After the molding compound MC is formed, connection elements 60 such as solder balls may be formed on the bottom surface 10b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a carrier substrate having a top surface;
a semiconductor die mounted on the top surface;
a plurality of first bonding wires connecting the semiconductor die to the carrier substrate;
a first insulating material encapsulating the plurality of first bonding wires;
a component mounted on the insulating material, wherein the component comprises a metal layer, the component protrudes beyond a contact point between the component and the insulating material thereby constituting an overhang having a width between the contact point and an edge of the component;
a plurality of second bonding wires connecting and directly bonded to the metal layer of the component to the carrier substrate, wherein the metal layer and the plurality of second bonding wires constitute an electromagnetic interference (EMI) shielding structure;
a second insulating material encapsulating the plurality of second bonding wires; and
a molding compound covering the top surface of the carrier substrate and encapsulating the semiconductor die, the component, the plurality of first bonding wires, the plurality of second bonding wires, the first insulating material, and second insulating material.

2. The semiconductor package according to claim 1, wherein the component comprises a dummy silicon die.

3. The semiconductor package according to claim 1, wherein the component is attached to the insulating material by an adhesive layer.

4. The semiconductor package according to claim 1, wherein the metal layer is a continuous layer of metal that completely covers a surface of the component so as to form a lid of the EMI shielding structure.

5. The semiconductor package according to claim 1, wherein the metal layer comprises an aluminum layer.

6. The semiconductor package according to claim 1, wherein the plurality of second bonding wires is electrically coupled to a ground ring on the top surface of the carrier substrate.

7. The semiconductor package according to claim 1, wherein the plurality of second bonding wires and the metal layer are grounded.

8. The semiconductor package according to claim 1, wherein the first insulating material is disposed in a rectangular, ring shape around the semiconductor die.

9. The semiconductor package according to claim 1, wherein the first insulating material and the molding compound have different compositions.

10. The semiconductor package according to claim 1, wherein the first insulating material completely covers the plurality of first bonding wires and is in direct contact with a peripheral region of an active surface of the semiconductor die.

11. The semiconductor package according to claim 1 wherein the second insulating material completely covers the plurality of second bonding wires and is in direct contact with a perimeter and a bottom surface of the component.

12. The semiconductor package according to claim 1, wherein the first insulating material and the second insulating material have different compositions.

13. The semiconductor package according to claim 1, wherein the carrier substrate comprises a packaging substrate.

14. The semiconductor package according to claim 1 further comprising:
a spacer between the component and the semiconductor die.

* * * * *